United States Patent
Sebastian et al.

(10) Patent No.: US 8,746,588 B2
(45) Date of Patent: Jun. 10, 2014

(54) PIEZOELECTRIC ACTUATOR AND INJECTOR COMPRISING A PIEZOELECTRIC ACTUATOR FOR AN INTERNAL COMBUSTION ENGINE

(75) Inventors: Thomas Sebastian, Erdmannhausen (DE); Klaus Sassen, Marbach/N (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1212 days.

(21) Appl. No.: 12/297,904

(22) PCT Filed: Apr. 18, 2007

(86) PCT No.: PCT/EP2007/053748
§ 371 (c)(1),
(2), (4) Date: Oct. 21, 2008

(87) PCT Pub. No.: WO2007/131857
PCT Pub. Date: Nov. 22, 2007

(65) Prior Publication Data
US 2009/0134245 A1 May 28, 2009

(30) Foreign Application Priority Data
May 11, 2006 (DE) .......................... 10 2006 021 945

(51) Int. Cl.
  *B05B 1/08* (2006.01)
  *B05B 3/04* (2006.01)
  *H01L 41/00* (2013.01)
  *H02N 2/00* (2006.01)

(52) U.S. Cl.
  USPC ......... 239/102.2; 310/311; 310/328; 310/348

(58) Field of Classification Search
  USPC .......... 239/102.2, 533.3, 533.4, 533.5, 533.9; 310/311, 328, 348, 357, 358, 365, 366
  See application file for complete search history.

(56) References Cited

U.S. PATENT DOCUMENTS

| | | | | |
|---|---|---|---|---|
| 4,229,812 A | * | 10/1980 | Holloway | 367/158 |
| 4,553,059 A | * | 11/1985 | Abe et al. | 310/328 |
| 4,582,240 A | * | 4/1986 | Lux et al. | 228/121 |
| 4,633,120 A | | 12/1986 | Sato et al. | |
| 4,958,101 A | * | 9/1990 | Takahashi et al. | 310/328 |
| 6,274,967 B1 | | 8/2001 | Zumstrull et al. | |
| 6,715,731 B1 | * | 4/2004 | Post et al. | 251/129.06 |
| 6,861,649 B2 | * | 3/2005 | Massie | 850/54 |
| 2005/0199745 A1 | * | 9/2005 | Berlemont | 239/88 |
| 2006/0186767 A1 | * | 8/2006 | Redding et al. | 310/365 |

FOREIGN PATENT DOCUMENTS

| | | |
|---|---|---|
| DE | 19818068 A1 | 10/1999 |
| DE | 19914411 A1 | 10/2000 |
| DE | 102004012863 A1 | 10/2004 |
| DE | 102004018100 A1 | 11/2004 |
| EP | 0144655 A1 | 6/1985 |

* cited by examiner

*Primary Examiner* — Ryan Reis
(74) *Attorney, Agent, or Firm* — Michael Best & Friedrich LLP

(57) ABSTRACT

A piezoelectric actuator and an injector for an internal combustion engine are proposed, the electromagnetic compatibility of which is significantly improved in comparison with conventional injectors. The actuator head and/or actuator foot is manufactured out of a ceramic material, thus reducing the capacitance of the electric capacitor that is formed between the electrical ground and the piezoelectric actuator. An advantage of the piezoelectric actuator according to the invention is that no additional components are required. The change from metallic materials to ceramic materials also increases the rigidity of the piezoelectric actuator since ceramic materials have a significantly higher modulus of elasticity than metals.

18 Claims, 2 Drawing Sheets

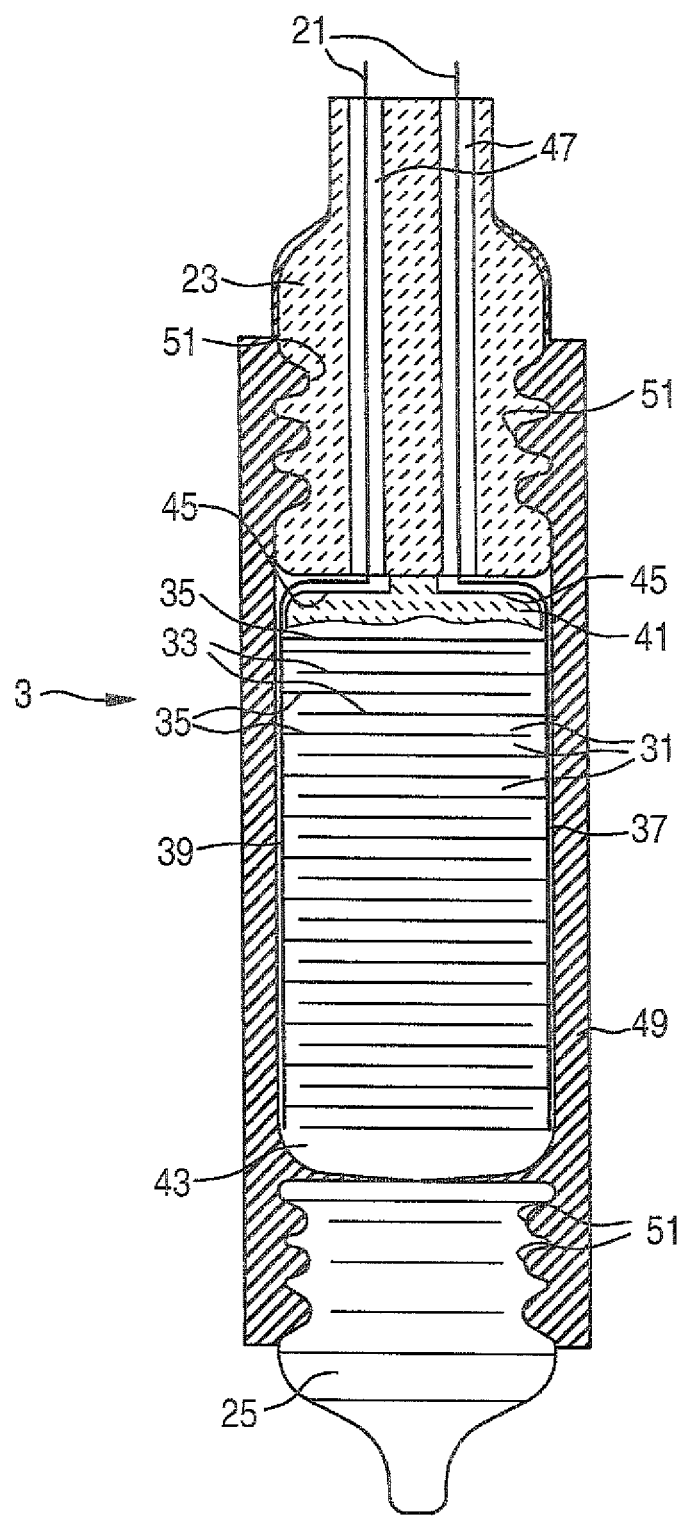

PIEZOELECTRIC ACTUATOR AND INJECTOR COMPRISING A PIEZOELECTRIC ACTUATOR FOR AN INTERNAL COMBUSTION ENGINE

CROSS-REFERENCE TO RELATED APPLICATION

This application is a 35 USC 371 application of PCT/EP 2007/053748 filed on Apr. 18, 2007.

BACKGROUND OF THE INVENTION

Field of the Invention

The invention is based on a piezoelectric actuator.

There are already known piezoelectric actuators, e.g. from DE 198 38 862 A1, which have piezoelectric ceramic layers that are placed one on top of another to form a multilayered stack, with a respective electrode layer provided between each pair of the piezoelectric ceramic layers. The electrode layers are connected to a power supply by means of a first external electrode and a second external electrode.

Piezoelectric actuators are advantageously triggered cyclically at a high frequency by a control unit. The rapid switching actions produce significant electromagnetic interference that must be reduced through complex measures in the control unit or in the electric supply lines of the piezoelectric actuators.

OBJECT AND SUMMARY OF THE INVENTION

The object of the present invention is to create a piezoelectric actuator and an injector equipped with a piezoelectric actuator, both of which have improved electromagnetic compatibility (EMC).

In a piezoelectric actuator, which includes a stack of a plurality of piezoelectric ceramic layers with a respective electrode layer provided between each pair of piezoelectric ceramic layers and has a foot part and a head part, this object is attained according to the invention in that the foot part and/or the head part is composed of a ceramic material.

The invention counteracts the interference signals coming from the piezoelectric actuator at their point of origin. Because the actuator head and/or actuator foot is manufactured out of a ceramic material, this reduces the capacitance of the electric capacitor that is formed between the electrical ground and the piezoelectric actuator. This sharply reduces the intensity of the interference signals generated with the switching of the piezoelectric actuator and therefore improves the electromagnetic compatibility of the piezoelectric actuator according to the invention.

Preferably, the actuator head and the actuator foot are composed of a ceramic material that is selected to have the lowest possible dielectric constant. Aluminum oxide, for example, has turned out to be a particularly advantageous material. Another significant advantage of the piezoelectric actuator according to the invention lies in the fact that no additional components are required so that the number of components does not increase. The change from metallic materials to ceramic materials also increases the rigidity of the piezoelectric actuator since ceramic materials have a significantly higher modulus of elasticity than metals.

Since the piezoelectric actuator itself is also composed of a ceramic material, the manufacture of the actuator head and actuator foot can be integrated with relative ease, from a production engineering standpoint, into the manufacturing process of the piezoelectric actuator. This simplifies the manufacture of the actuator according to the invention and results in no additional assembly steps in the overall manufacturing chain.

According to a particularly advantageous embodiment of the invention, the piezoelectrode layers of the piezoelectric actuator are contacted by means of two external electrodes and the external electrodes are routed between the foot part and an end surface of the actuator. As a result, it is easily possible in particular to protect the ends of the external electrodes from mechanical damage.

According to a particularly advantageous modification of this embodiment, at least one cable conduit is provided in the foot part and the electrical lines extend in the cable conduit or conduits. This makes it possible to easily connect the piezoelectric actuator to the power supply. This type of power supply and contacting of the external electrodes is extremely rugged and therefore also very reliable.

The piezoelectric actuator according to the invention can be further improved with regard to its electromagnetic compatibility if the actuator is enclosed by an elastic, fluid-tight jacket; this jacket is connected in a sealed fashion to the head part and the foot part. It is thus possible to dispense with a closed metal housing and there is a further reduction in the interference signals coming from the piezoelectric actuator. This simultaneously simplifies the structural complexity required for sealing the piezoelectric actuator in relation to fuel.

According to advantageous embodiments of the invention, the head part and/or the foot part has one or more circumferential grooves and the jacket is attached to the circumferential groove or grooves in a form-locked fashion. This results in a very durable, long-lasting, fluid-tight attachment of the jacket to the actuator head and actuator foot.

The jacket can be manufactured by extrusion coating the actuator, the head part, and the foot part with rubber or plastic.

Alternatively, it is also possible for the jacket to be manufactured out of a heat-shrinkable sleeve. To this end, the heat-shrinkable sleeve is drawn over the actuator foot, the piezoelectric actuator, and the actuator head and is then heated. In reaction to the heat, the heat-shrinkable sleeve contracts and forms a fluid-tight jacket.

In an injector, which is for a fuel injection system of an internal combustion engine and has a housing and in which the housing contains a piezoelectric actuator, a hydraulic control valve, and a nozzle module equipped with a nozzle needle; at one end, the piezoelectric actuator rests at least indirectly against the housing; at the other end, the piezoelectric actuator rests at least indirectly against the control valve; and an adjusting plate is provided between the piezoelectric actuator and the control valve, the object mentioned at the beginning is attained in that the adjusting plate is composed of a ceramic material.

The adjusting plate serves to compensate for length tolerances in the injector and to adjust the stroke of the piezoelectric actuator. Here, too, the change of the material from a metallic material to a ceramic material can increase the electromagnetic compatibility of the injector without increasing the number of components. At the same time, the transmission of the stroke of the piezoelectric actuator to the control valve is improved due to the greater rigidity of the ceramic adjusting plate. This also improves the operating behavior of the injector according to the invention.

Because as a rule, ceramic materials also have a lower specific gravity than metal, in particular steel, the change of the material also reduces the mass inertia of the moving parts of the injector, which has an advantageous effect on the dynamics of the injector.

The electromagnetic compatibility of the injector according to the invention is further improved if a spacer composed of a ceramic material is provided between the piezoelectric actuator and the housing.

This also increases the rigidity inside the injector according to the invention and simultaneously improves the electromagnetic compatibility.

According to a particularly advantageous embodiment of the injector according to the invention, it is thus possible to combine the measures according to the invention and for their effects to be at least partially added to each other. This yields an injector with a very favorable electromagnetic compatibility. This makes it possible to eliminate complex measures for suppressing the interference signals of the interference signal coming from the piezoelectric actuator or else makes it possible to at least replace these measures with very much simpler and less expensive alternative measures.

All of the measures proposed according to the invention share the feature of not increasing the number of components so that they entail no additional manufacturing and assembly complexity.

In addition, the measures according to the invention require no additional space, which constitutes another very important advantage. As a result, it is frequently also possible to completely or partially retrofit series produced injectors without significant structural changes. For example, the adjusting plates can be replaced with ceramic adjusting plates, without structural changes. The same is true for the spacers between the actuator and the housing. Naturally, it is also possible to install the piezoelectric actuator according to the invention in conventional piezoelectric injectors, Here, too, no structural changes to the housing of the injector, the control valve, or the nozzle module are required.

BRIEF DESCRIPTION OF THE DRAWINGS

The invention will be explained in greater detail below in conjunction with the drawings.

FIG. 1 shows a longitudinal section through a first exemplary embodiment of an injector according to the invention and FIG. 2 shows a partial longitudinal section through an exemplary embodiment of a piezoelectric actuator according to the invention.

DESCRIPTION OF THE PREFERRED EMBODIMENTS

Figure 1:
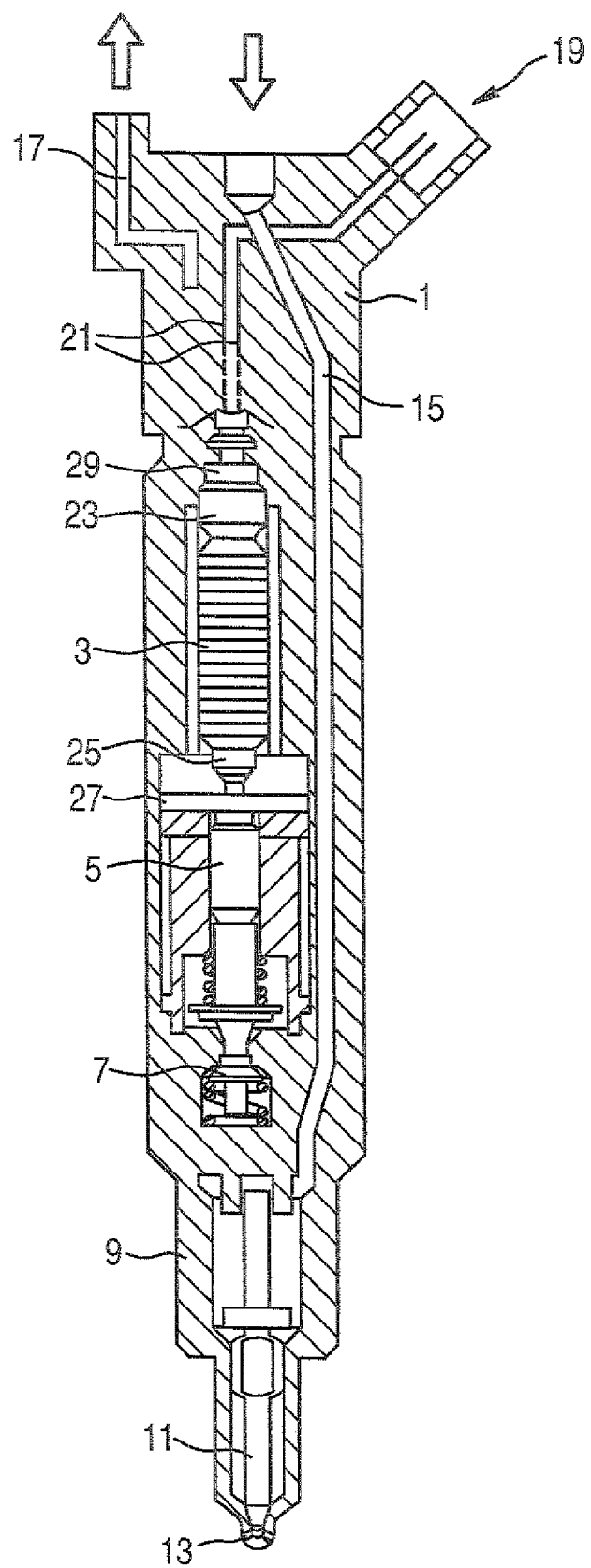

FIG. 1 shows a very simplified longitudinal section through a piezoelectric actuator according to the invention. The piezoelectric actuator according to the invention has a housing 1. The housing 1 contains a piezoelectric actuator 3, a hydraulic coupler 5, a control valve 7, and a nozzle module 9 equipped with a nozzle needle 11 and has a plurality of injection ports 13. The housing 1 of the injector is also provided with a high pressure connection 15, a leakage outlet 17, and a power supply 19.

Via the power supply 19, the injector is connected to a control unit that is not shown. When the piezoelectric actuator 3 is to be activated, an engine control unit (not shown) applies an electrical voltage to the power supply 19. The power supply 19 is connected to the piezoelectric actuator 3 via electrical lines 21. It is thus possible to activate the piezoelectric actuator 3 by triggering the power supply 19. FIG. 1 does not show the details of the electrical contacting of the piezoelectric actuator.

With its upper end in FIG. 1, the piezoelectric actuator 3 rests via a foot part 23 against the housing 1 of the piezoelectric actuator. According to the invention, this foot part 23 is composed of a ceramic material with the lowest possible dielectric constant. Aluminum oxide, for example, is a suitable ceramic material.

Beneath the piezoelectric actuator 3, there is a head part 25, which transmits the actuator stroke to the hydraulic coupler 5 via an adjusting plate 27. According to the invention, the head part and/or the adjusting plate 25 is composed of a ceramic material with a low dielectric constant. The replacement of the foot part 23, the head part 25, and the adjusting plate 27, which are usually manufactured of steel, with parts composed of a ceramic material that has a low dielectric constant drastically reduces the capacitance of the capacitor formed by the piezoelectric actuator 3 and the electrical ground of the vehicle in which the injector according to the invention is installed. This also drastically reduces the interference signals that the high-frequency triggering of the piezoelectric actuator introduces into the vehicle via the electrical ground. This consequently improves the electromagnetic compatibility of the piezoelectric actuator according to the invention. This embodiment has the particular advantage that the cause of the interference signals is effectively counteracted and as a result it is possible to completely or partially dispense with complex measures, whether in the wiring harness or in the control unit of the internal combustion engine.

Another significant advantage of the invention is that the measures according to the invention require no additional space and also do not increase the number of components. Finally, it should also be noted that the ceramic materials have a very much greater modulus of elasticity than steel or other metallic materials, thus increasing the rigidity of the apparatus according to the invention, which is composed of the foot part 23, the head part 25, the piezoelectric actuator 3, and the adjusting plate 27. This improves the dynamics of the piezoelectric actuator according to the invention and of the injector equipped with this actuator, thus increasing the effective stroke of the piezoelectric actuator and of the actuating element (unnumbered) in the control valve 7.

As an additional measure, it is also possible for a spacer 29 to be provided above the head part 25. The spacer 29 is situated between the housing 1 of the injector and the foot part 23 of the injector and is likewise composed of a ceramic material with a low dielectric constant.

FIG. 2 shows a partial section through a particularly advantageous embodiment of the piezoelectric actuator 3 according to the invention.

In this significantly enlarged depiction of the piezoelectric actuator 3, it is evident that the actual piezoelectric actuator is composed of a plurality of ceramic layers 31, which for the sake of visibility, have not all been provided with reference numerals. Electrode layers 33 and 35 are situated between the ceramic layers 31. Here, too, for the sake of visibility, not all of the electrode layers 33 and 35 have been provided with reference numerals.

The electrode layers 33 constitute a first group of electrode layers and are connected in an electrically conductive fashion to a first external electrode 37.

The electrode layers 35 constitute a second group of electrode layers and are connected in an electrically conductive fashion to a second external electrode 39.

Above the uppermost electrode layer 35 in FIG. 2, a first cover layer 41 is depicted in sectional fashion. This first cover layer 41 is thicker than the ceramic layers 31, as is the second cover layer 43 situated beneath the lowermost electrode layer 33. The two cover layers are likewise composed of a ceramic material. Usually, they are composed of the same ceramic material as the ceramic layers 31. The cover layers 41 and 43, however, make no contribution to the stroke of the piezoelectric actuator 3 since no electrical field between an electrode layer 33 and an electrode layer 35 is produced in them when the piezoelectric actuator 3 is supplied with current.

The first cover layer 41 has recesses 45 let into it, in which the first external electrode 37 and the second external electrode 39 are routed. This means that the external electrodes 37 and 39 end at one end surface of the piezoelectric actuator 3.

Two cable conduits 47 are provided in the foot part 23 of the piezoelectric actuator 3. The electrical lines 21 extend in the cable conduits 47. The electrical lines 21 are connected in an electrically conductive fashion to the respective external electrodes 37 and 39 in the region of the end surface of the piezoelectric actuator 3. This type of contact is extremely rugged since the contact point is enclosed on all sides, whether by the first cover layer 41 of the piezoelectric actuator 3 or by the foot part 23 of the piezoelectric actuator 3.

Because the foot part 23 is also composed of ceramic material, it is possible to manufacture the electrical connection between the electrical lines 21 and the external electrodes 37 and 39 in the same manufacturing process in which the electrical connection is also produced between the electrode layers 33 and 35 and the external electrodes 37 and 39. This results in a simplification of the manufacturing process and a higher throughput.

FIG. 2 clearly shows another essential defining characteristic of the piezoelectric actuator 3 according to the invention: Usually, piezoelectric actuators must be sealed in a fluid-tight fashion in relation to their surroundings. In conventional piezoelectric actuators, this is achieved by placing a metal housing around the piezoelectric actuator 3, the bead part 25, and the foot part 23. Naturally, this metal housing must be elastic enough to permit it to transmit the stroke of the piezoelectric actuator 3 without breaking. This metal housing is very cost-intensive and has a negative impact on the electromagnetic compatibility.

In the piezoelectric actuator 3 according to the invention, the piezoelectric actuator 3, the head part 25, and the foot part 23 are encompassed by a jacket 49. This jacket 49 completely encloses the piezoelectric actuator 3 and partially encloses the foot part 23 and the head part 25. The jacket 49 can be produced, for example, by extrusion coating the foot part 23, the head part 25, and the piezoelectric actuator 3 with rubber or an elastic plastic. Alternatively, it is also possible for the jacket 49 to be composed of a heat-shrinkable sleeve, which, in its stretched state, is slid over the foot part 23, the piezoelectric actuator 3, and the head part 25. Then, the heat-shrinkable sleeve is heated and contracts as a result. This produces a seal of the piezoelectric actuator 3 that is fluid-tight and sufficiently elastic.

In order to even further increase the ruggedness of the connection between the jacket 49 on the one hand and the foot part 23 and head part 25 on the other, a plurality of circumferential grooves 51 are provided in both the foot part 23 and the head part 25. These circumferential grooves 51 permit a form-locked connection between the jacket 49 and the foot part 23 and head part 25.

The foregoing relates to the preferred exemplary embodiment of the invention, it being understood that other variants and embodiments thereof are possible within the spirit and scope of the invention, the latter being defined by the appended claims.

The invention claimed is:

1. A piezoelectric actuator, comprising:
a stack of a plurality of piezoelectric ceramic layers;
a respective electrode layer provided between each pair of piezoelectric ceramic layers; and
a foot part and a head part, wherein the foot part and/or the head par is composed of a ceramic material,
wherein the piezoelectric actuator is covered either by a coating which has been extruded onto the actuator to form an extrusion coating, or by a heat-shrinkable sleeve which has been drawn over the actuator and then heated such that it has contracted to form a fluid-tight, heat-shrunk sleeve on the actuator.

2. The piezoelectric actuator as recited in claim 1, wherein the head part and/or the foot part is composed of aluminum oxide.

3. The piezoelectric actuator as recited in claim 1, wherein the electrode layers of the piezoelectric actuator are contacted by two external electrodes and the external electrodes are routed between an end surface of the actuator and the foot part.

4. The piezoelectric actuator as recited in claim 2, wherein the electrode layers of the piezoelectric actuator are contacted by two external electrodes and the external electrodes are routed between an end surface of the actuator and the foot part.

5. The piezoelectric actuator as recited in claim 3, further comprising at least one cable conduit provided in the foot part, and electrical lines extend in the at least one cable conduit, wherein the electrical lines are connected in an electrically conductive fashion to the external electrodes.

6. The piezoelectric actuator as recited in claim 4, further comprising at least one cable conduit provided in the foot part, and electrical lines extend in the at least one cable conduit, wherein the electrical lines are connected in an electrically conductive fashion to the external electrodes.

7. The piezoelectric actuator as recited in claim 1, wherein the sleeve or coating comprises a fluid-tight jacket and the jacket is attached in a sealed fashion to the head part and foot part.

8. The piezoelectric actuator as recited in claim 2, wherein the sleeve or coating comprises a fluid-tight jacket and the jacket is attached in a sealed fashion to the head part and foot part.

9. The piezoelectric actuator as recited in claim 4, wherein the sleeve or coating comprises a fluid-tight jacket and the jacket is attached in a sealed fashion to the head part and foot part.

10. The piezoelectric actuator as recited in claim 7, wherein the head part and/or the foot part has at least one circumferential groove and the jacket is attached to the at least one circumferential groove in a form-locked fashion.

11. The piezoelectric actuator as recited in claim 7, wherein the jacket is manufactured by extrusion coating the actuator, the head part, and the foot part with rubber or plastic.

12. The piezoelectric actuator as recited in claim 10, wherein the jacket is manufactured by extrusion coating the actuator, the head part, and the foot part with rubber or plastic.

13. An injector for a fuel injection system of an internal combustion engine comprising:
a housing;
a piezoelectric actuator contained in the housing;
a hydraulic control valve contained in the housing;
a nozzle module contained in the housing, the nozzle module equipped with a nozzle needle, wherein at one end the piezoelectric actuator rests at least indirectly against the housing, and at an other end the piezoelectric actuator rests at least indirectly against the control valve; and an adjusting plate provided between the piezoelectric actuator and the control valve, wherein the adjusting plate is composed of a ceramic material.

14. The injector as recited in claim 13, further comprising a spacer made of a ceramic material provided between the piezoelectric actuator and the housing.

15. The injector as recited in claim 13, wherein the piezoelectric actuator is comprised by:
   a stack of a plurality of piezoelectric ceramic layers;
   a respective electrode layer provided between each pair of piezoelectric ceramic layers; and
   a foot part and a head part, wherein the foot part and/or the head par is composed of a ceramic material.

16. The injector as recited in claim 14, wherein the piezoelectric actuator is comprised by:
   a stack of a plurality of piezoelectric ceramic layers;
   a respective electrode layer provided between each pair of piezoelectric ceramic layers; and
   a foot part and a head part, wherein the foot part and/or the head par is composed of a ceramic material.

17. The injector as recited in claim 13, wherein the adjusting plate is composed of aluminum oxide.

18. The injector as recited in claim 14, wherein the spacer is composed of aluminum oxide.

\* \* \* \* \*